United States Patent
Macia

(10) Patent No.: US 6,224,389 B1
(45) Date of Patent: May 1, 2001

(54) COMPONENT FOR CONTACTING A MEASURING UNIT AND METHOD FOR ITS PRODUCTION

(75) Inventor: Antonio Esteve Macia, BR-Tremembe-S.P. (BR)

(73) Assignee: Mannesmann VDO AG, Frankfurt (DE)

(*) Notice: Subject to any disclaimer, the term of this patent is extended or adjusted under 35 U.S.C. 154(b) by 0 days.

(21) Appl. No.: 09/331,542

(22) PCT Filed: Dec. 18, 1997

(86) PCT No.: PCT/EP97/07130

§ 371 Date: Aug. 19, 1999

§ 102(e) Date: Aug. 19, 1999

(87) PCT Pub. No.: WO98/28819

PCT Pub. Date: Jul. 2, 1998

(30) Foreign Application Priority Data

Dec. 24, 1996 (DE) .............................. 196 54 382

(51) Int. Cl.⁷ .................................................. H01R 1/00
(52) U.S. Cl. .................................................. 439/58
(58) Field of Search ........................... 439/82, 83, 517, 439/58

(56) References Cited

U.S. PATENT DOCUMENTS 2,757,319   7/1956   Kapp .
4,097,101 * 6/1978   Holt et al. ................ 339/221 R
4,894,018   1/1990   Phillips et al. .
4,934,943 * 6/1990   Klein et al. ...................... 439/65
5,096,440   3/1992   Katsumata .

FOREIGN PATENT DOCUMENTS

1095403 * 12/1960 (DE) .
4039625    6/1992  (DE) .
4240454    6/1994  (DE) .

* cited by examiner

*Primary Examiner*—Neil Abrams
*Assistant Examiner*—J. F. Duverne
(74) *Attorney, Agent, or Firm*—Martin A. Farber

(57) ABSTRACT

The component (5) has a substrate (6), which comprises a number of contact bridges (7) corresponding to the number of contact elements (2) of the meter (1) which are to be electrically bonded, the contact bridges (7) having soldering tags (8, 9) bent at right angles to one another. The soldering tags (8) can be inserted through the printed-circuit board (3) and be soldered to the contact surfaces (4) of the latter. In this case, the substrate (6) is located on that side of the printed-circuit board (3) which is free of contact surfaces. The other soldering tags (9), which likewise project from the electrically insulating substrate (6) made of plastic, are provided with openings (11), through which the contact elements (2) pass when the meter (1) is being mounted on the printed-circuit board (3) and may be soldered mechanically in the same way as the soldering tags (8).

6 Claims, 2 Drawing Sheets

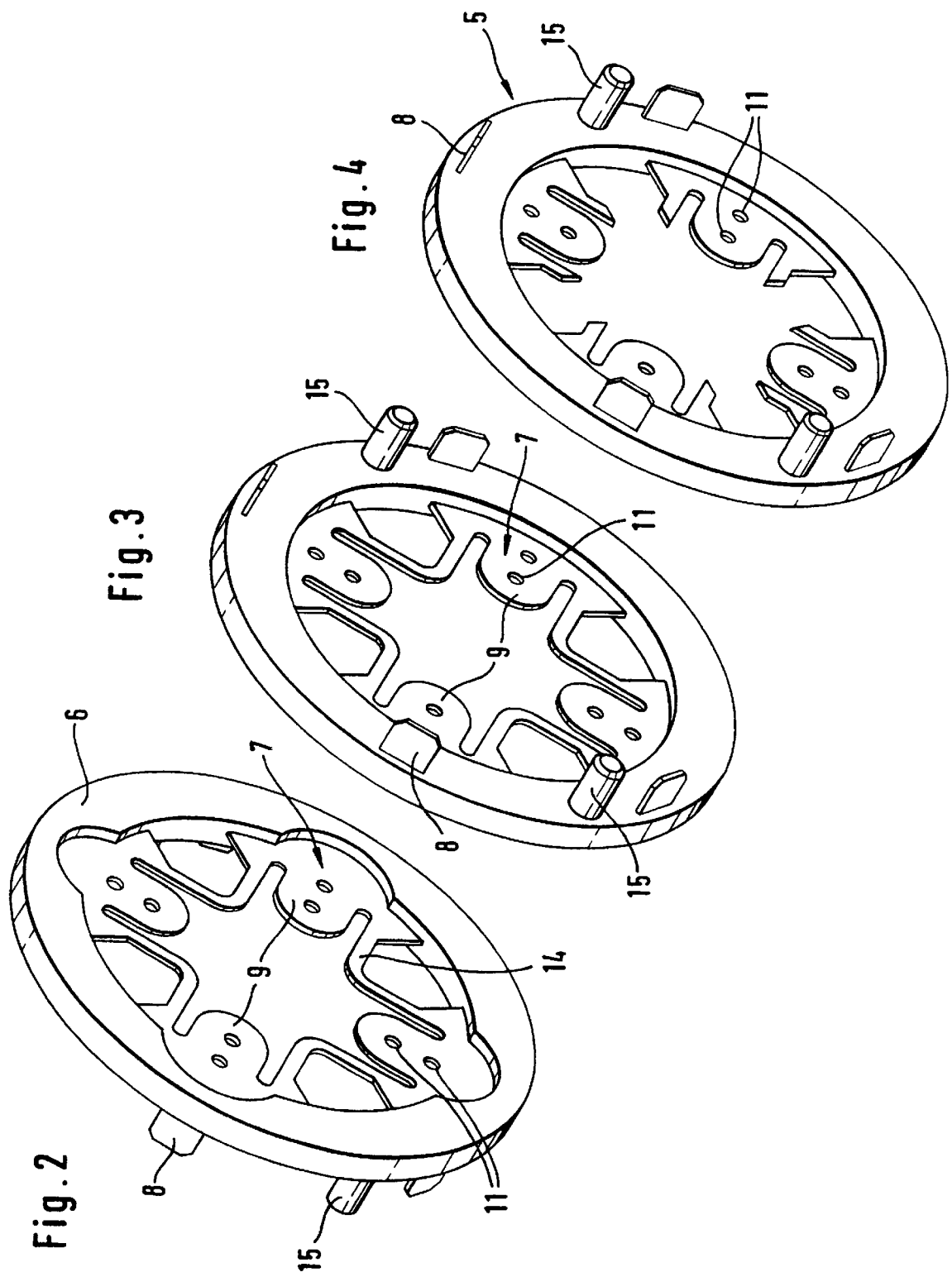

COMPONENT FOR CONTACTING A MEASURING UNIT AND METHOD FOR ITS PRODUCTION

FIELD AND BACKGROUND OF THE INVENTION

The invention relates to a component for the electrical bonding of a meter, during which a meter having at least two contact elements can be electrically bonded by a soldered joint to a printed-circuit board having at, least two contact surfaces on one side. The invention also relates to a method of producing this component.

If meters, for example moving permanent-magnet ratiometers, which preferably have four contact elements, are to be electrically bonded to a copper-clad printed-circuit board which carries the corresponding contact surfaces only on one side, only the use of individual contact tubes for making the contact is possible if it is desired to avoid individual manual soldering work, which is very laborious on account of the presence of the meter on the same side of the printed-circuit board on which the contact surfaces are located. DE 40 39 625 A1, for example, discloses such contact tubes. Contact tubes which are designed for screwing into place by fastening screws which at the same time produce an electrical bonding are used there. However, this electrical bonding and fastening in one operation also requires special contact tubes, which require special tools in order to produce them, as well as a certain assembly effort, since as a rule the meters are fastened with four screws.

SUMMARY OF THE INVENTION

The object of the invention is to produce a component, by means of which, on the one hand, the soldered joint between this component and the contact surfaces of the printed-circuit board and, on the other hand, the soldered joint between the component and the contact elements of the meter can in each case be executed mechanically and thus cost-effectively and quickly.

The object of the invention is also to provide method of producing such a component.

This object is achieved according to the invention in that a substrate has a number of contact bridges which correspond to the number of contact elements of the meter, wherein each contact bridge has two soldering tags, which are bent essentially at right angles to one another and of which one soldering tag can be inserted through the printed-circuit board in order to produce a soldered joint with the contact surface of the printed-circuit board, and the other soldering tag has an opening for receiving the contact element of the meter, and in that, on that side of the printed-circuit board which is remote from the contact surfaces, the substrate, while bearing against the printed-circuit board, holds the contact bridges in a fixed spatial relationship corresponding to the contact-element arrangement of the meter.

By means of such a component, it is possible first of all to attach the component to that side of the printed-circuit board which is remote from the contact surfaces, the contact tags being inserted through the printed-circuit board. In this state, it is possible to subject the printed-circuit board, thus assembled, to a mechanical soldering operation, during which the projecting ends of the soldering tags are soldered to the contact surfaces of the printed-circuit board. The meter may then be mounted on the printed-circuit board from the side which carries the contact surfaces. In the process, the contact elements pass through appropriately prepared openings in the printed-circuit board and may be inserted into the respective openings in the soldering tags of the contact bridges. In this state, on that side of the printed-circuit board which is remote from the meter, a joint can be made between the contact elements of the meter and the soldering tags of the contact bridges, again by a mechanical soldering operation. Such electrical bonding of the meter is therefore simple, since, despite the presence of contact surfaces only on that side of the printed-circuit board on which the meter is to be mounted, it permits mechanical soldering of all the contact elements in each case in one operation without special assembly or alignment work with regard to the soldering tags being necessary, since the latter are held in a fixed spatial relationship to one another by the substrate, which spatial relationship corresponds to the spatial arrangement of the contact elements on the meter. When one operation for the soldered joint is referred to here, this relates to the making of contact between the contact elements of the meter on the one hand and the contact bridges on the other hand. However, since both operations can be carried out mechanically and only require a small amount of -time, the execution of both operational sequences is also substantially more efficient than the electrical bonding by means of individual contact tubes.

In order to ensure reliable positioning of the substrate with the contact bridges on the printed-circuit board, the substrate, in a development of the invention, may have positioning pins in order to spatially orient it on the printed-circuit board.

A method of producing such a component is defined according to the invention in that the contact bridges are blanked out of an electrically conductive material, in that connecting webs connecting the soldering tags for the contact elements of the meter are blanked out with the contact bridges in the process, in that the soldering tags intended for the electrical bonding to the contact surfaces of the printed-circuit board are bent at right angles to the soldering tags of the contact elements, in that this blank, in order to form a substrate holding the contact bridges, is encapsulated by molding with an electrically insulating plastic connecting the contact bridges to one another in their bent region, and in that the connecting webs are then cut out. After the connecting webs have been cut out, the component is finished and comprises contact bridges which are disposed spatially in a predetermined relationship to one another and are insulated from one another by the plastic.

In a development of the method, the positioning pins may be injection molded along with the substrate when the latter is being produced.

BRIEF DESCRIPTION OF THE DRAWINGS

The invention is explained in more detail below with reference to an exemplary embodiment shown in the drawing, in which:

FIG. 2 shows a perspective rear view of a component serving for the electrical bonding before its final manufacture;

FIG. 3 shows a perspective front view of the component according to FIG. 2; and

FIG. 4 shows a perspective front view of a component ready for the electrical bonding.

DETAILED DESCRIPTION OF THE PREFERRED EMBODIMENT

Figure 1:
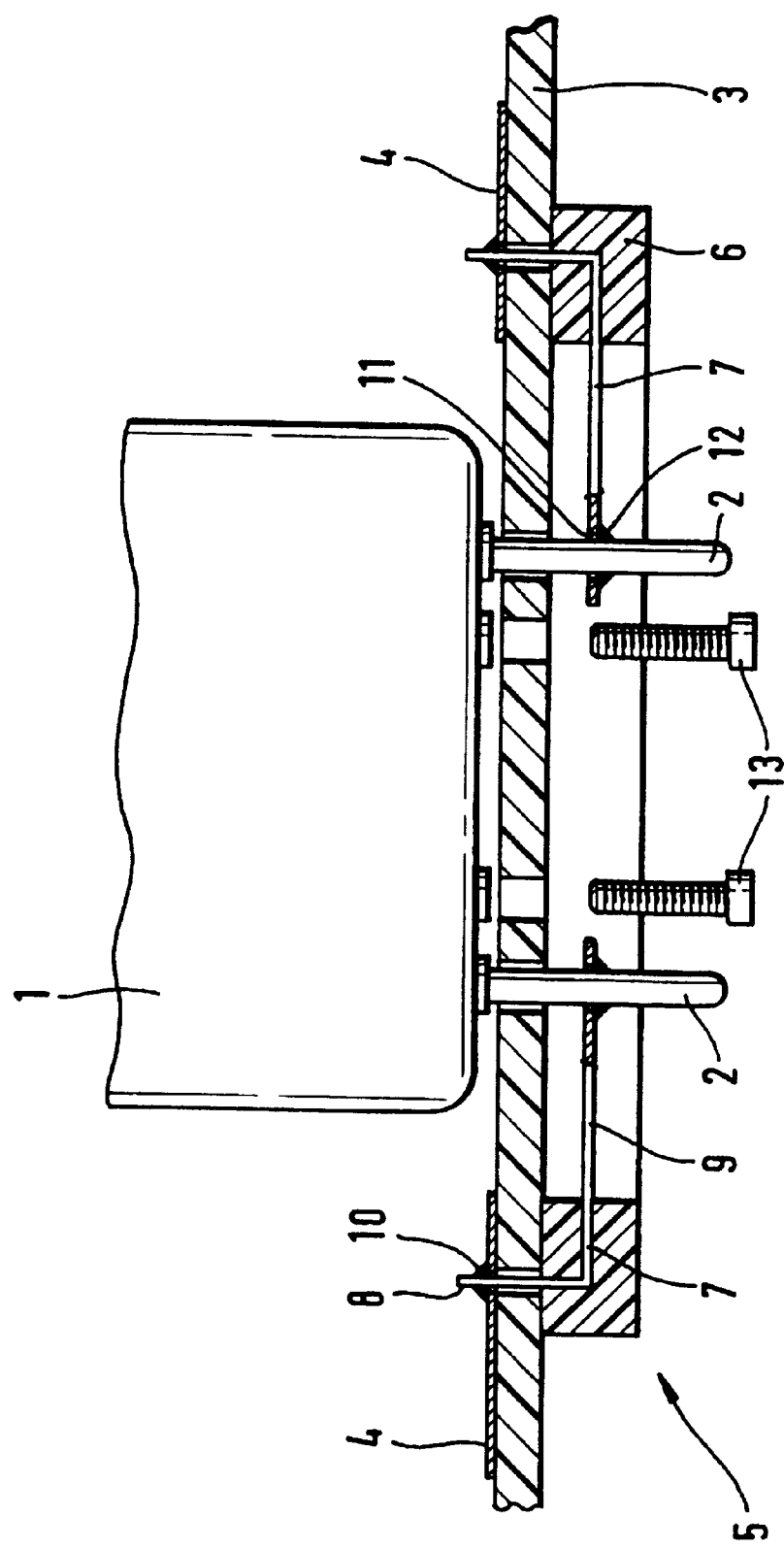
FIG. 1 shows a schematically indicated meter on a printed-circuit board in the electrically bonded state, the printed-circuit board and the component serving for the electrical bonding being shown in section.

FIG. 1 shows a meter 1 having two contact elements 2, which are inserted through a printed-circuit board 3, the meter 1 sitting on the printed-circuit board 3. On this side, the printed-circuit board 3 is provided with circuit-board conductors or contact surfaces 4. Attached to the underside of the printed-circuit board 3, which is free of contact surfaces, is a component which is designated overall by 5 and comprises a plastic substrate 6 and contact bridges 7, which have two soldering tags 8 and 9 bent at right angles to one another. The soldering tags 8 and 9 project beyond the substrate 6, so that the soldering tags 8 may be inserted through the printed-circuit board 3 and soldered to the contact surfaces 4 by means of a soldered joint 10. The other soldering tags 9 run parallel to the printed-circuit board 3 and are provided with openings 11, through which the contact elements 2 are passed and may be soldered mechanically in the same way as the soldered joints 10, so that soldered joints 12 result. The meter 1 may be tightly screwed to the printed-circuit board by means of screws 13.

As can be seen from FIGS. 2 to 4, four contact bridges 7 are held in an annular substrate 6 for a moving permanent-magnet ratiometer, the substrate 6 being produced by encapsulating the contact bridges 7 by molding. Before this injection molding operation, the contact bridges 7 are blanked from a flat electrically conductive material, connecting webs 14 being left between the individual contact bridges, the connecting webs lying in the plane of the soldering tags 9. After this blanking operation, the soldering tags 8 are bent at right angles, whereupon the substrate 6 is formed by encapsulation of this blank by molding. In this case, the substrate is essentially located in the bent region of the contact bridges, so that the soldering tags 8 and 9 project beyond the substrate 6. This stage of the manufacturing process is highlighted in FIGS. 2 and 3. 15 designates positioning pins for securing the substrate 6 to the printed-circuit board so that the contact elements 2 can engage exactly in the openings 11 when the meter 1 is mounted.

FIG. 4 shows the finished state of a component, in which the connecting webs 14 are removed, so that the contact bridges 7, although in a fixed spatial relationship to one another, are no longer connected to one another electrically.

In the representation according to FIGS. 2 to 4, the soldering tags 9 are each provided with two openings 11. As a result, the component 5 can also be used for other meters having different spacings between the contact elements.

What is claimed is:

1. A component for an electrical bonding of a meter, said meter having at least two contact elements to be electrically bonded by soldered joints to a printed-circuit board having at least two contact surfaces on one side, wherein a substrate (6) has a number of contact bridges (7) which correspond to the number of contact elements (2) of the meter (1), wherein each contact bridge (7) has a first and a second soldering tag (8, 9) disposed essentially at a right angle to each other and of which the first soldering tag (8) can be inserted through the printed-circuit board (3) in order to provide a joint for soldering with the contact surface (4) of the printed-circuit board (3), and the second soldering tag (9) has an opening (11) for receiving one of the contact elements (2) of the meter (1), and wherein, on a side of the printed-circuit board (3) which is remote from the contact surfaces (4), the substrate (6) bears against the printed-circuit board (3) and holds the contact bridges (7) in a fixed spatial relationship corresponding to a contact-element arrangement of the meter (1).

2. The component as claimed in claim 1, wherein the substrate (6) has positioning pins (15) in order to spatially orient the substrate on the printed-circuit board (3).

3. A method of producing the component as claimed in claim 1, wherein contact bridges are blanked out of a blank of an electrically conductive material, wherein connecting webs connecting the soldering tags for the contact elements of the meter are blanked out with the contact bridges in the process, wherein the soldering tags intended for the electrical bonding to the contact surfaces of the printed-circuit board are bent at right angles to be soldering tags intended for contact with the contact elements, wherein said blank, in order to form a substrate holding the contact bridges, is encapsulated with an electrically insulating plastic connecting the contact bridges to one another in their bent region, and wherein the connecting webs are then cut out.

4. The method as claimed in claim 3 for producing said component wherein the substrate (6) has positioning pins (15) in order to spatially orient the substrate on the printed-circuit board (3), wherein the positioning pins are injection molded along with the substrate when the latter is being produced.

5. A component as claimed in claim 1, wherein the substrate extends along the printed circuit board on the side thereof remote from the contact surfaces and, wherein, in each of said contact bridges, the first soldering tag is perpendicular to the printed circuit board, and the second soldering tag is parallel to the printed circuit board.

6. The method as claimed in claim 3, further comprising a step of positioning the substrate along the printed circuit board on the side thereof remote from the contact surfaces, and, wherein, in each of said contact bridges, the first soldering tag is perpendicular to the printed circuit board, and the second soldering tag is parallel to the printed circuit board.

* * * * *